United States Patent
Benard et al.

(10) Patent No.: US 7,079,118 B2
(45) Date of Patent: *Jul. 18, 2006

(54) TOUCH SCREEN USING ECHO-LOCATION

(75) Inventors: David J. Benard, Newbury Park, CA (US); Robert C. Addison, Thousand Oaks, CA (US); Dong-Feng Gu, Thousand Oaks, CA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/784,627

(22) Filed: Feb. 23, 2004

(65) Prior Publication Data

US 2004/0164970 A1     Aug. 26, 2004

Related U.S. Application Data

(63) Continuation of application No. 09/938,095, filed on Aug. 23, 2001, now Pat. No. 6,741,237.

(51) Int. Cl.
   *G09G 5/00*     (2006.01)

(52) U.S. Cl. .................. 345/173; 345/177

(58) Field of Classification Search ............ 345/173, 345/177, 175, 179, 178; 178/18.01, 18.02, 178/18.03, 18.04, 18.09, 20.01, 19.01, 19.02; 340/706; 367/101
See application file for complete search history.

(56) References Cited

U.S. PATENT DOCUMENTS

| | | | |
|---|---|---|---|
| 6,335,723 B1 * | 1/2002 | Wood et al. ............. | 345/173 |
| 6,441,809 B1 * | 8/2002 | Kent et al. ............. | 345/177 |
| 6,723,929 B1 * | 4/2004 | Kent .................. | 178/18.04 |
| 6,741,237 B1 * | 5/2004 | Benard et al. ........... | 345/173 |

* cited by examiner

*Primary Examiner*—Vijay Shankar
*Assistant Examiner*—Nitin Patel
(74) *Attorney, Agent, or Firm*—Amin & Turocy, LLP; Alexander M. Gerasimow

(57) ABSTRACT

A plurality of acoustic wave transducers are coupled to a substrate at predetermined spaced apart locations. At least one of the transducers is operative to emit an acoustic wave that propagates along the substrate, with the other transducers operating as receivers of acoustic waves. The receivers are coupled to a control system that is operative to determine a location at which the substrate is perturbed based on time associated with travel of an acoustic wave from a transmitter, to the location of the perturbation, and from the perturbation to each of the respective receivers.

16 Claims, 9 Drawing Sheets

TOUCH SCREEN USING ECHO-LOCATION

CROSS-REFERENCE TO RELATED APPLICATIONS

This application is a continuation application of U.S. patent application Ser. No. 09/938,095, filed Aug. 23, 2001, now U.S. Pat. No. 6,741,237 entitled TOUCH SCREEN.

TECHNICAL FIELD

The present invention relates human-machine interfaces and, more particularly, to a touch screen system and to a corresponding methodology for operating a touch screen system.

BACKGROUND OF THE INVENTION

Various types of touch screen monitors have been developed to facilitate user interaction with graphical user interfaces (GUIs). Touch screens are gaining popularity for numerous applications, including point-of-information kiosks, vending, electronic catalogs, in-store locators, corporate training, gaming, lottery, and amusement, multimedia marketing, banking/financial transactions, ticket sales, interactive education, multimedia demos, museum displays, and the like. A touch screen generally employs one of four types of touch technologies: capacitive, resistive, infrared, and surface acoustic wave (SAW). In general, capacitive and resistive touch technologies both rely on overlays, whereas infrared and SAW configurations typically do not require overlays.

By way of illustration, an analog resistive screen is formed of a sandwich of Mylar and plastic or glass separated by substantially transparent elastic spacers. The inside surfaces of the sandwich are coated with a uniform transparent thin film, such as a conductive coating. In operation, a voltage is alternately applied along horizontal and vertical axes of the screen. When a user depresses the Mylar overlay so that its conductive layer contacts the energized layer, the resulting voltage is sensed and transmitted to a controller that converts the signal to an indication of touch location.

In a capacitive type of touch screen, a glass panel is coated with a conductive coating that is fused into the glass. The coating is connected to electrodes located at edges of the screen. Each electrode is connected to an oscillator circuit. When a user touches the screen, the body capacitance of the user causes a change in the impedance of the screen. The impedance change causes the oscillator frequencies to vary, and the frequency differentials are converted into a corresponding X-Y coordinate.

The IR technology employs an array of infrared (IR) light emitting diode (LED)/photodetector pairs mounted in a frame. In operation, the LED/photodetector array is continuously and sequentially scanned horizontally and then vertically. When a user touches the display breaking one or more of the light beams, the X-Y position of the touch can be transmitted to a controller or host computer. In order to increase the maximum resolution of an IR touch screen to approximately double the number of LED/photodetector pairs, an interpolation technique can be employed. Using interpolation, when an odd number of beams is broken along either axis, the X or Y coordinate of the center beam is transmitted, but when an even number of beams is broken, the coordinates of the interpolated beam are calculated and transmitted to the host computer.

Today, most commercial acoustic touch screen systems employ surface acoustic waves (SAWs) as the acoustic mode propagating in a faceplate, although other modes can be used, such as horizontally or transversely polarized shear waves. In one particular type of SAW touch screen system (sometimes referred to as the Adler system), the presence and location of a finger or stylus on a faceplate is determined based on disruption of one or more SAWs propagating on the screen. This method propagates a SAW on one side of the faceplate in a beam that is near an edge of the screen. A series of reflectors, which can be gratings, are located along the edge of the screen, each of which reflects a portion of the energy across the faceplate at about 90° relative to the edge and the direction in which the beam is traveling. The density of reflectors is varied so that the amplitude of the signals propagating across the faceplate is nearly constant. A second set of reflectors are located at the opposite edge of the screen, which reflect the SAW into a beam propagating substantially parallel to the edge. The spacing of the reflectors is chosen so that the multiple beams propagating across the faceplate cover substantially the entire surface. The arrival time of the various beams at the receiving transducer increases monotonically as the total path length increases.

By way of illustration, when a finger or other object contacts the screen, it interrupts the SAW causing a decrease in the received amplitude corresponding to the position of the finger or object. As a result, this approach bases detection on the blockage or disruption of a transmitted SAW and on the spacing of the multiplicity of beams for spatial resolution.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides system and method for implementing a touch screen system. The system includes a substrate having a surface and at least three acoustic wave transducers at spaced apart locations. One or more transducers are operative to transmit an acoustic wave that propagates along the substrate surface. The other transducers are operative to receive acoustic waves that propagate along the substrate surface. A control system associated with at least the receiving transducers are operative to determine which part of the substrate surface is perturbed, such as by a finger, a stylus, or other object. The location of the perturbation can be determined based on when the acoustic wave is transmitted and when a corresponding acoustic wave is received at each of the second and third transducers, which corresponding wave was reflected or scattered from the part of the substrate surface that was perturbed.

In accordance with a particular aspect of the present invention, time delays between transmission of the acoustic wave and receipt of the corresponding acoustic wave at the other transducers define respective ellipses. An intersection between such ellipses corresponds to a location of the part of the substrate surface that was perturbed. Thus, by detecting the time delays between transmission and receipt of acoustic waves relative to the transducers, coordinates on the substrate surface can be determined for each perturbation.

Another aspect of the present invention provides a method, which can be implemented as hardware and/or software, to discern a location at which a surface of a substrate is perturbed. The method includes transmitting an acoustic wave that propagates across a substrate surface. An acoustic wave is detected at two or more transducers. A first time value is set to a time delay between when the acoustic wave is transmitted and the detection at one of the transducers and a second time value is set to a time delay between when the acoustic wave is transmitted and the detection at another of the transducers. An indication of the location at which a surface of a substrate is perturbed, thus, can be determined based on the first and second time values.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

The present invention provides a system and method of implementing a surface acoustic wave touch screen. A plurality (e.g., three or more) of acoustic wave transducers are coupled to a substrate at predetermined spaced apart locations. At least one of the transducers is operative to emit an acoustic wave that propagates through the substrate, with the other transducers operating as receivers of acoustic waves. The receivers are coupled to a control system that is operative to determine a location at which the substrate is perturbed based on the times associated with travel of an acoustic wave from a transmitter, to the location of the perturbation, and from the perturbation to each of the receivers.

While, for simplicity of explanation, the following examples are described with respect to surface acoustic waves (SAWs) propagating across the substrate, those skilled in the art will understand and appreciate that other types and/or modes of waves could be propagated relative to the substrate in accordance with an aspect of the present invention. For example, other wave types in the family of plate waves or Lamb waves could be utilized in implementing a touch screen system in accordance with an aspect of the present invention.

Figure 1:
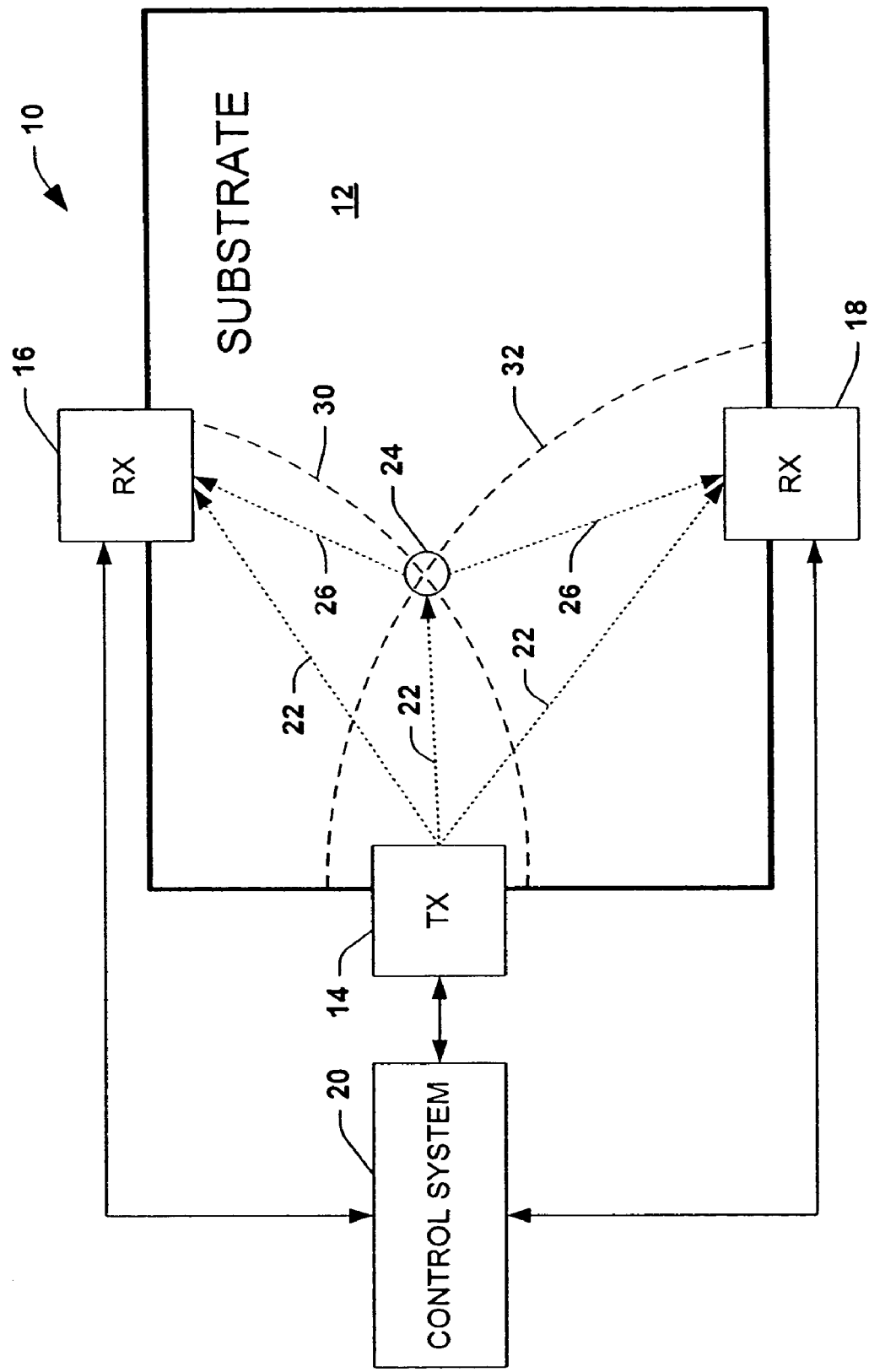
FIG. 1 is an example of a touch screen system in accordance with an aspect of the present invention.

FIG. 1 illustrates a touch screen system 10 in accordance with an aspect of the present invention. The system 10 includes a substrate 12 of a material having a generally low acoustic attenuation to facilitate propagation of acoustic waves relative to the substrate. In accordance with a particular aspect, the acoustic waves are surface acoustic waves (SAWs) that propagate along a surface of the substrate 12. By way of example, the substrate 12 could be formed of soda-lime glass, borosilicate glass, a crown glass, a barium-containing glass, a strontium-containing glass, a boron-containing glass, and a glass laminate capable of supporting acoustic propagation. The substrate 12 also could be formed of a ceramic material, aluminum or an alloy thereof, a coated aluminum substrate capable of supporting SAW propagation, a low-acoustic-loss polymer, or the like.

A plurality of acoustic wave transducers 14, 16, and 18 are acoustically coupled to the substrate 12. The transducers 14, 16, and 18 also are coupled to a control system 20. The transducers 14, 16, and 18, for example, include piezoelectric elements and other associated circuitry for transmitting and/or receiving SAW relative to the substrate 12. Those skilled in the art will understand and appreciate various types of piezoelectric materials that could be utilized in the transducers 14, 16, and 18 in accordance with an aspect of the present invention.

In the example of FIG. 1, the transducer 14 is configured as a transmitter operative to convert an electrical signal into a mechanical signal that propagates as a SAW along the surface of the substrate 12. The other transducers 16 and 18 are configured as receivers operative to receive SAWs, convert the SAW into an electrical signal, and provide the control system 20 information indicative of the received SAWs.

The control system 20 is programmed and/or configured to control operation of the system 10 in accordance with an aspect of the present invention. By way of illustration, the control system 20 includes a microprocessor and memory. The memory can include read only memory (ROM), random access memory (RAM), and/or other storage types of storage. The memory serves to store program code executed by the processor for carrying out operating functions of the system 10 as described herein. The memory also serves as a storage medium for temporarily storing information, such as control data, position coordinate tables, data mapping coordinates with wave travel time, and algorithms that may be employed in carrying out the present invention.

By way of illustration, the control system 20 controls the transducer 14 to transmit a SAW 22 that propagates across the surface of the substrate 12. The control system 20 can control the transducer 14 to transmit the SAW 22 periodically at a fixed rate or at controlled intervals. The SAW 22 also has a frequency greater than about 300 KHz, such as from about 1 to about 5 MHz or greater. It is to be appreciated, however, that the present invention is not limited to any particular frequency of SAW.

The transducer 14 is configured to emit the SAW 22 with a broad diffraction angle, such that the SAW can directly propagate across substantially the entire surface of the substrate 12, excluding reflection. For the illustrated example where the transducer 14 is located along a side edge of the substrate 12, the diffraction angle should be near 180 degrees. Alternatively, the transducer 14 could be located at a corner of the substrate 12, in which case the diffraction angle should be about 90 degrees with the SAW 22 emitted at about 45 degrees relative to the adjacent side edges that meet to define the corner. The diffraction angle can be configured by providing an aperture through which the SAW 22 is transmitted, which aperture is sized as a function of the wavelength (or frequency) of the SAW to provide the desired diffraction angle.

When the substrate surface is perturbed, such as at location 24, the SAW 22 contacts the object at 24, which could be a finger, a stylus or any other object that might be employed to touch the surface of the substrate 12. As the direct SAW 22 contacts the object at 24, part of the SAW scatters or reflects from the object. The reflected or scattered SAWs are illustrated at 26. The reflected SAW 26 travels generally radially from the location of the perturbation 24 to the other transducers 16 and 18.

In accordance with an aspect of the present invention, the location of the perturbation at 24 relative to the substrate 12 can be determined as a function of the time for the SAW 22 to travel from the transducer 14 to the location of the perturbation at 24 and from the location 24 to each of the other transducers 16 and 18. Specifically, the time for the SAW 22 to travel from the transducer 14 and reflect from the object at 24 as SAW 26 and reach the transducer 16 defines a first ellipse 30, in which the transducers 14 and 16 are the foci of the ellipse. Similarly, a second ellipse 32 is defined by the time of travel for the SAW 22 and SAW 26 reflected from the object at 24 to the transducer 18. The transducers 14 and 18 are foci of the ellipse 32. The intersection of the ellipses 30 and 32 defines the location of the perturbation 24. As a result, coordinates on the substrate surface (e.g., a touch point) can be discerned as a function of the time delays for an emitted SAW 22 to reflect from a location at which the substrate 12 is perturbed and reach the other respective transducers 16 and 18.

The transducers 16 and 18 provide signals to the control system 20 indicative of SAWs received by each of the transducers. It is to be appreciated that because the relative location of the transducers 14, 16 and 18 are fixed relative to the substrate, the direct SAW 22 provided by the transducer 14 will reach each of the transducers 16 and 18 at a time prior to the reflected or scattered SAWs 26 and 28, respectively. Consequently, the electrical signals corresponding to a first SAW detected after transmission by the transducer 14 can be ignored. Similarly, any SAWs reflected from a perimeter portion of the substrate 12 typically will reach transducers 16 and 18 subsequent to the SAW 26 reflected by an object 24 at an interior location of the substrate surface. Thus, reflected SAWs that arrive at the transducers 16 or 18 outside of predetermined time window also can be ignored.

In order to mitigate reflection from the perimeter portion of the substrate, a suitable dampening material can be applied along the perimeter portion of the substrate 12. Such a material should have a high acoustic attenuation and acoustic impedance similar to the substrate 12 through which the SAWs propagate. By way of illustration, the material can be a wax material, such as is commercially available from Apiezon, which is a business unit of M&I Materials Ltd., a company located in Manchester, United Kingdom.

Figure 2:
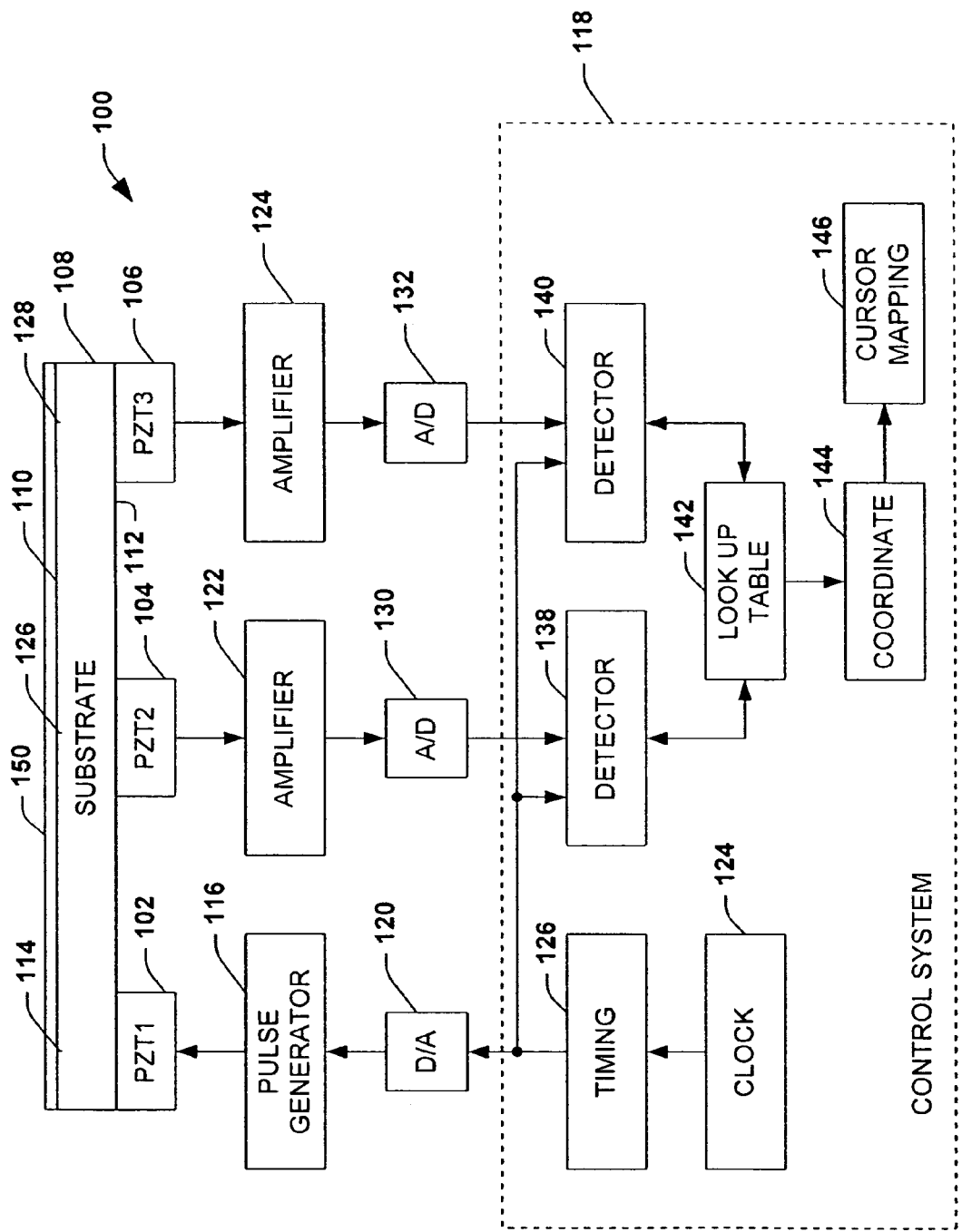
FIG. 2 is a schematic block diagram of a touch screen system in accordance with an aspect of the present invention.

FIG. 2 illustrates a schematic block diagram of a touch screen system 100 in accordance with an aspect of the present invention. The system 100 includes a plurality of transducers 102, 104 and 106 operatively coupled to a substrate 108. The substrate 108, for example, is configured as a generally flat or curved plate having a surface 110 that provides a medium across which surface acoustic waves can propagate. Each of the transducers 102, 104, 106 can be attached to a surface 112 of the substrate 108 opposite the surface 110. The transducers 102, 104, and 106 typically include piezoelectric elements configured to convert an electrical signal into mechanical stress and/or mechanical stress into an electrical signal.

In this example, transducer 102 is configured as a transmitter that is operative to transmit a longitudinal wave to the substrate 108. The longitudinal wave travels transversely through the substrate 108 and contacts a grating 114 located adjacent the surface 110. The grating 114 is configured and oriented to reflect or redirect the longitudinal wave from the transducer 102 about 90 degrees and convert the longitudinal wave to a SAW. The transducer 102 and grating 114 are configured such that the resulting SAW propagates across substantially the entire surface 110 of the substrate 108. By way of example, the transducer 102 includes a wedge-shaped piezoelectric element located at a corner of the substrate 108 and operative to direct the SAW at about a forty-five degree angle relative to the adjacent side edges and with a diffraction angle of about ninety degrees.

The transducer 102 is electrically coupled to a pulse generator 116. The pulse generator 116 is programmed and/or configured to electrically energize the transducer 102 to cause the transducer to transmit the longitudinal wave at a desired rate, intermittently or periodically. The pulse generator 116 is operatively coupled to a control system 118 through a digital-to-analog (D/A) converter 120.

The transducers 104 and 106 also are operatively coupled to the control system 118. In particular, the transducers 104 and 106 are coupled to amplifier systems 122 and 124, respectively. Each of the amplifiers 122 and 124 is configured to amplify the electrical signals provided by the respective transducers 104 and 106 in response to sensing a SAW traveling across the surface 110 of the substrate 108. Similar to the association of the transducer 102 relative to the substrate 108, the transducers 104 and 106 are operatively coupled to the side 112 with respective gratings 126 and 128 disposed above associated piezoelectric elements of the respective transducers. Thus, as a SAW propagating across the surface 110 reaches the gratings 126 and 128 such SAWs are directed as longitudinal waves to the transducers 104 and 106. The transducers 104 and 106, in turn, convert the acoustic waves into electrical signals indicative of the waves received at the transducers. The electrical signals are provided to the respective amplifier systems 122 and 124. The amplifiers 122 and 124 are respectively coupled to the control system 118 through associated analog-to-digital (A/D) converters 130 and 132.

The control system 118 is programmed and/or configured to control operation of the system 100. To control operation of the pulse generator 116, for example, the control system 118 includes a system clock 134 and a programmable timing system 136. The system clock 134, for example, emits clock pulses according to a preprogrammed clock rate. The clock signal is provided to the timing system 136. The timing system 136 is programmed to activate the transducer 102 at a desired rate. Thus, the timing system 136 provides an electrical signal to the D/A converter 120 to activate the pulse generator 116 to supply desired electrical energy to the transducer 102. The timing system 136 is programmed and/or configured to intermittently cause the pulse generator to activate the transducer 102 at a desired rate, such as based on a predetermined number of clock cycles. Alternatively, the pulse generator 116 could be programmed to activate the transducer 102 to transmit the acoustic wave at a desired rate, such as based on an internal clock.

The control system 118 also includes detector systems 138 and 140 that receive the amplified signals from the respective transducers 104 and 106. Each of the detector systems 138, 140 also receives the output of the timing system 136, which provides an indication of the start time (time zero) when the transducer 102 transmits the SAW. Alternatively, such an indication can be obtained directly from the pulse generator 116. Accordingly, each of the detector systems 138 and 140 is programmed and/or configured to determine time delays for an acoustic wave to travel from the transducer 102 to an object contacting the substrate surface 110 and scatter or reflect to each of the respective transducers 104 and 106. Because the locations of the transducers 102, 104 and 106 relative to the substrate 108 are fixed, a direct SAW transmitted from the transducer 102 reaches the other transducers 104 and 106 in a generally constant time period for each transmission, which is prior to receipt of any reflected waves. Accordingly, the detectors 138 and 140 can ignore an initial electrical signal for each activation of the transducer 102, such as by implementing a suitable filter (e.g., hardware and/or software). Thus, only the second wave need be considered as a potential perturbation of the substrate surface 110, which wave should arrive at each of the transducers 104 and 106 within a predictable time window. In order to further mitigate the effects of extraneous reflected SAWs along the substrate surface 110, a suitable dampening material can be applied along a perimeter portion of the substrate 108.

When the surface 110 is perturbed, such as by a finger, a stylus or other object, the detectors 138 and 140 provide output signals to a lookup table 142. The output signals from the detectors 138 and 140 provide an indication of time delays for a SAW to travel from the transducer 102, reflect and/or scatter at a location at which the substrate surface 110 is being perturbed, and reach each of the other respective transducers 104 and 106. The lookup table 142 can be preprogrammed to provide an output that identifies a location or two-dimensional coordinates 144 on the substrate surface 110 corresponding to the location at which the substrate surface 110 has been perturbed.

For example, the lookup table 142 can be programmed with two matrices of time values. One matrix is operative to determine an X-coordinate and the other matrix is operative to determine the Y-coordinate associated with a touch point at the substrate surface 110. Both matrices receive as inputs the two time intervals (or delays) determined by the detectors 138 and 140 based on receipt of the scattered SAW at the transducers 104 and 106. The matrices employ the time intervals as indices to discern which matrix elements define the resulting coordinates 144 of the touch point. Alternatively, an algorithm model can be employed to calculate the coordinates in response to the time intervals determined by the detectors 138 and 140.

By way of further example, the lookup table 142 can be programmed to define matrix elements for each pixel on the screen of known coordinates (x,y). The two time delays can be calculated using the Pythagorean theorem for the length of a right triangle's hypotenuse in terms of the lengths of the other two sides. To facilitate processing, the calculated time delays are both truncated to integers to identify the indices of the corresponding matrix elements which are then filled with the known x and y values in the two matrices, respectively. This procedure is repeated for every pixel on the surface of the touch screen to fill out the lookup tables. Because truncation errors can cause some matrix elements to be filled out twice and others not at all, the lookup table is analyzed and the empty elements are filled by averaging (e.g., interpolation) based on the available nearest neighbor matrix elements that have not been patched in this manner. The averaging can be implemented horizontally and/or vertically within the matrix, as the gaps caused by truncation errors tend to appear in isolated (e.g., one element wide) columns or rows for a few adjacent elements in a line, but usually not in a region of adjacent (side by side) columns or rows. By calculating the time intervals in a reverse manner from pixel coordinates, the calculations and associated programming are facilitated.

By way of further example, the transducers 102 and 104 are foci of a first set of such elliptical paths and the transducers 102 and 106 are foci of a second set of such elliptical paths. An intersection between a pair of elliptical paths from each matrix is mapped to each pixel or a corresponding two-dimensional coordinate 144 associated with the substrate surface 110. The desired pixel size will define the resolution of the substrate surface 110. The coordinate 144 of the substrate surface further can be provided to a cursor mapping function 146 or to another output function that can be employed to implement desired action in response to a detected perturbation on the substrate surface 110.

It will be understood and appreciated by those skilled in the art that other methods can be employed to program a lookup table in accordance with an aspect of the present invention. For example, matrix elements could be calculated from known time intervals, which generally will not require patching. Alternatively, the time values could be mapped to matrix elements that define elliptical paths along the surface of the substrate. One matrix corresponds to ellipses associated with the transducer 104 and the other matrix corresponds to ellipses associated with the other transducer 106. An intersection between the ellipses defines coordinates of the touch point. Yet another alternative could be a hybrid approach that employs part of the elliptical analysis in conjunction with lookup table method described in the preceding example.

In another approach, one might desire to implement the system to be more CPU intensive, such as by implementing a coordinate determining algorithm to derive coordinates from the time data each time a touch is detected. By way of example, a mathematical formula, such as a polynomial expansion, or an expansion of another type of basis function to approximate the mathematical surfaces represented by the X and Y matrices in the look up table. In such an implementation, the constant coefficients of such basis functions need to be accurately determined to model the substrate surface. Because the surfaces to be approximated are mathematically smooth, the number of terms (eg., the constants to be stored in memory) that are required to achieve a desired pixel level accuracy will be much smaller than the storage needed for a comparable lookup table. However, this and other mathematical approaches typically required considerably more CPU processing to produce the coordinates than the lookup table approach described above.

It is to be appreciated that the lookup table approach can be combined with a mathematical approach. For example, a low resolution lookup table can be employed to provide a first approximation to the solution. The CPU then can be programmed to interpolate or calculate a better answer by employing a suitable numerical method, such as described above. The lookup table further could be utilized to determine and test the algorithms used in the mathematical approach and/or set of expansion coefficients that can deliver desired results with pixel accuracy. Those skilled in the art will understand and appreciate that the particular manner in which the x and y coordinates are determined thus can depend on design considerations, including CPU capacity and available memory storage.

In order to mitigate detection of undesired objects, such as a liquid droplet, as an intended perturbation, a sheet 150 of an elastically deformable material can be positioned over the substrate surface 110 in accordance with an aspect of the present invention. The sheet 150, for example, can be a microsheet of a glass material. The sheet 150 can have a thickness ranging from about 30 µm to about 300 µm although other thicknesses could be utilized in accordance with an aspect of the present invention.

By way of illustration, the sheet 150 can rest on dust particles (from ambient air) or fine powder particles that are distributed over the substrate surface 110. The air gap created by the particles prevents coupling between the SAW and the sheet 150 when no perturbations occur. When the sheet 150 is urged toward the substrate 108 with sufficient force, such as by a finger, a stylus or other object, the sheet operates as a membrane that deforms locally and is forced against the substrate surface 110. The contact between the sheet 150 and the substrate surface 110 leads to scattering of the acoustic energy of a SAW transmitted by the transducer 102. When the force is removed from the elastically deformable sheet 150, the sheet returns to its starting position.

The acoustic scattering process is similar to that produced by a finger or other object pressed directly on the substrate surface 110. However, the sheet 150 typically is formed of a material that has an acoustic impedance that more closely matches that of the surface 110. This facilitates a stronger interaction with the SAW (e.g., sound energy passing from the substrate into the sheet 150). The energy lost from the substrate 108 into the sheet 150 results in larger acoustic scattering and/or reflection. It is the scattered SAW that is detected at transducers 104 and 106, in contrast to a conventional touchscreen that detects the absorption of energy at the touch point. The scattered acoustic waves result because of energy that is coupled into the sheet 150 or other object that contacts the substrate surface 110. Therefore, by constructing the sheet of a material that has an acoustic impedance that substantially matches the substrate 108, the transfer of energy from the substrate surface 110 to the sheet is facilitated. Consequently, the locally deformed part of the sheet 150 will scatter a larger fraction of the incident energy when compared to an object having a greater propensity to absorb acoustic energy (e.g., a finger). As a result, the sheet 150 can help increase the amplitude of the scattered SAW relative to an amplitude in a situation where a softer object is employed to directly contact the substrate surface 110.

Further, when an object, such as a finger or stylus, is pressed on the microsheet 150, the elastic deformation of the microsheet produces a substantially uniform contact area on the substrate surface 110 that tends to average out any irregularities. This produces an acoustic scattering pattern that is more angularly uniform than that provided by a finger or other generally soft object that could perturb the substrate 108.

The sheet 150 also helps shield the substrate surface 110 from liquid or other substances that could fall on to and/or remain at the surface. It is to be appreciated that, alternatively or additionally, the control system 118 could implement additional software to check for constant interruptions and produce a map of corresponding blind spots. However, even with such software, there might a blind spot on the faceplate until the 30 liquid droplet is removed. Thus, by employing a faceplate in accordance with an aspect of the present invention, there will be no blind spots on the faceplate that must be mapped out in software.

Figure 3:
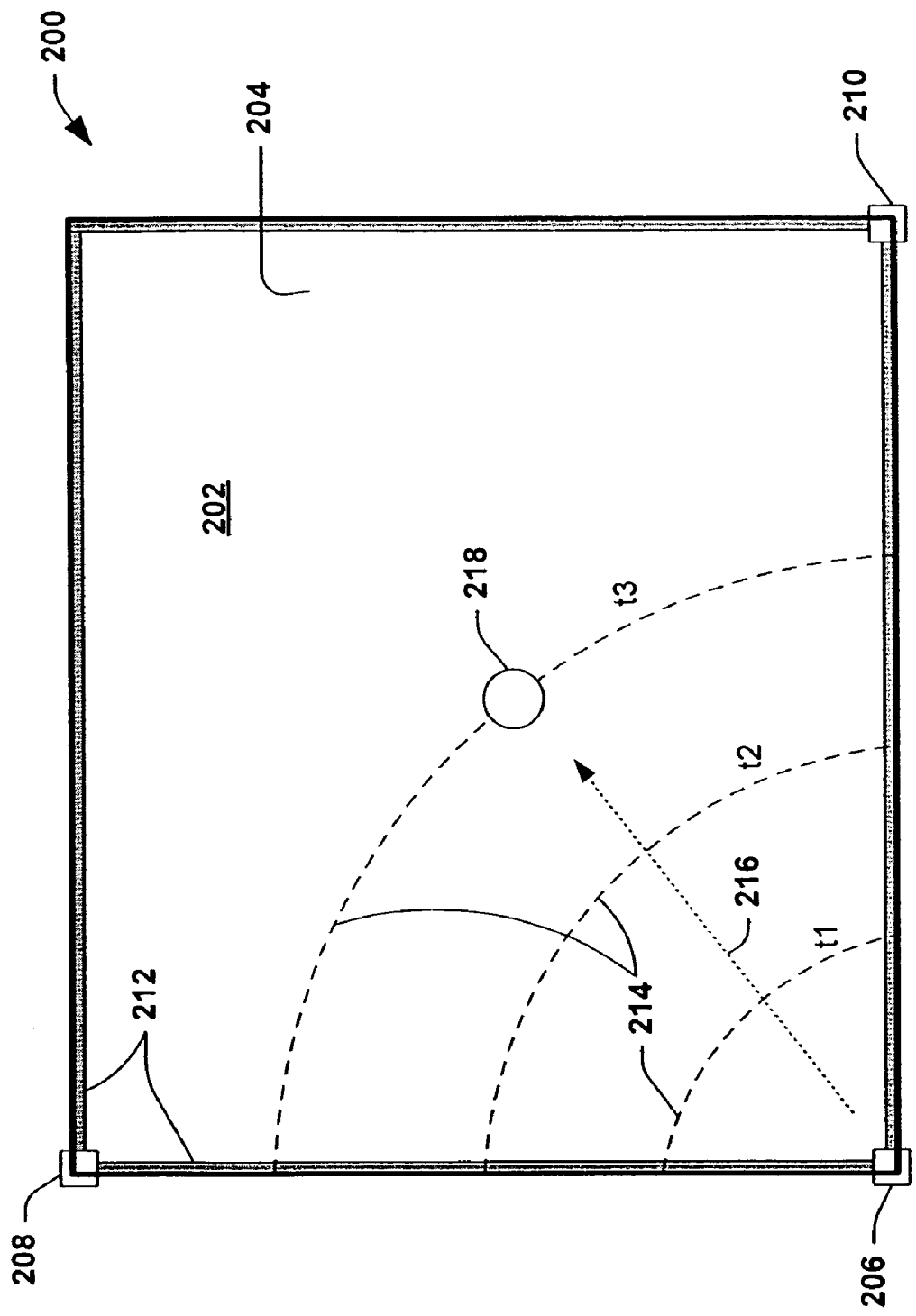
FIG. 3 is an example of a touch screen system, illustrating an acoustic wave from a transducer propagating across the surface of the screen in accordance with an aspect of the present invention.
Figure 4:
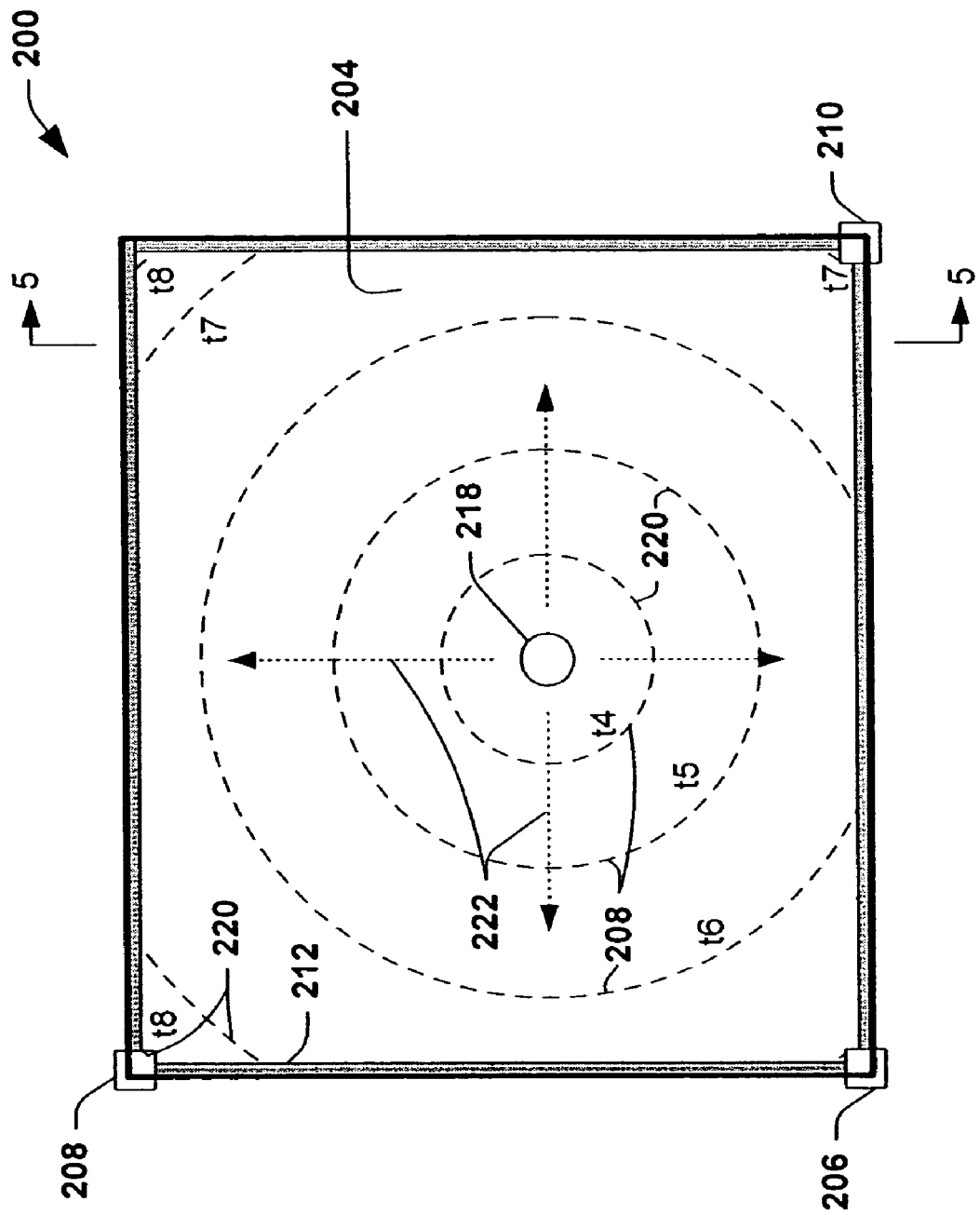
FIG. 4 is an example of the touch screen system of FIG. 3, illustrating an acoustic wave scattering from a perturbation and propagating across the surface of the screen in accordance with an aspect of the present invention.

FIGS. 3 and 4 illustrate an example of touch screen system 200 in accordance with an aspect of the present invention. The system 200 includes a substrate 202, such as a faceplate, having a surface 204 along which SAWs can propagate. The substrate 202 can be formed of any suitable material to facilitate propagation of SAWs and other modes of plate waves.

A plurality of acoustic wave transducers 206, 208, and 210 are located at different corners of the substrate 202. In the example of FIGS. 3 and 4, the transducer 206 operates as a transmitter and the other transducers 208 and 210 operate as receivers. The transducers 208 and 210 are located at diagonally (or diametrically) opposed corners of the substrate 202. While the example of FIGS. 3 and 4 depicts three transducers at respective corners, it is to be understood and appreciated that other numbers of transducers could be utilized and/or positioned at different spaced apart locations near the perimeter of the substrate 202. It is to be appreciated that, alternatively, two of the transducers 208 and 210 could operate as transmitters and the other transducer 206 as a receiver.

By way of illustration, the transducers 206, 208, and 210 are oriented to transmit and/or receive SAWs at about 45° relative to the adjacent edges at respective corners of the substrate 202. In addition, the each of the transducers 206, 208, and 210 is configured to have a diffraction angle that is about 90°. For example, each of the transducers 206, 208, and 210 has a small aperture selected as a function of the wavelength (or frequency) of the SAWs being transmitted by the transducer 206. As a result, the transducer 206 can propagate a SAW across the surface 204 that covers substantially the entire surface. The other transducers 208 and 210, in turn, can receive signals arriving from a large range of angles. The spatial resolution of the touch screen system 200 is functionally related to the wavelength of the SAW transmitted by the transducer 206.

In order mitigate interference from previous SAW transmissions, the edges of the substrate 202 also can be damped, such as by application of a suitable damping material 212 disposed near the perimeter of the substrate in accordance with an aspect of the present invention. The damping material 212 has a high acoustic attenuation and acoustic impedance similar to the substrate 202.

As mentioned above, the transducer 206 is controlled to transmit an acoustic wave that propagates as a SAW 214 across the substrate surface 204 in a direction indicated at 216. For purposes of simplicity of illustration, the SAW 214 is illustrated at different times t1, t2, t3 during its propagation in the direction 216. When the substrate surface 204 (or a microsheet over the surface) is perturbed at a location 218, the SAW 214 contacts the object at about time t3. The direct SAW from the transducer 206 continues to propagate across the surface 204 until it strikes the edges of the substrate 202, which results in the SAW being absorbed and/or reflected depending on the configuration at the edges. The direct SAW 214 also arrives at the other transducers 208 and 210 at times according to their distance relative to the transmitting transducer 206. Because the time the direct SAW 214 arrives at the transducers 208 and 210 is substantially fixed relative to the transmission time (assuming a constant frequency of SAW from the transducer 206), such signals can be ignored.

Referring now to FIG. 4, when the direct SAW 214 arrives at the perturbation location 218, the part of the SAW striking the perturbing object is scattered and/or reflected, indicated as SAW 220. The SAW 220 propagates in a radially outwardly direction away from the location 218, indicated at 222. In FIG. 4, the SAW 220 is illustrated at different times t4, t5, t6, t7 and t8 during its radial propagation away from the location 218. As previously mentioned, the direct SAW 214 from the transducer arrives at each of the transducers 208 and 210 prior to the reflected and/or scattered SAW 220.

At time t7, the SAW 220 reaches the transducer 210. The transducer 210, in turn, converts the SAW into a signal having an electrical characteristic indicative of the SAW 220 received by the transducer. Because the SAWS 214 and 220 propagate at a substantially constant speed relative to the substrate, the time t7 can be employed to define an ellipse. In particular, the ellipse includes the transducers 206 and 210 (located at the corners) as foci. The location 218 corresponds to a point along the respective ellipse. Because the transducers 206 and 210 (e.g., the foci) are oriented horizontally relative to FIG. 4, the major axis of the ellipse also is oriented horizontally.

At time t8, which is subsequent to t7, the SAW 220 then arrives at the transducer 208. The transducer 208 converts the SAW 220 into a signal having an electrical characteristic indicative of the SAW 220. The time t8 at which the SAW 220 arrives at the transducer 208 further defines a second ellipse having the transducers 206 and 208 as foci. The location 218 is a point along the second ellipse. Because the location at which the surface 204 was perturbed corresponds to unique points along two ellipses, the intersection of such ellipses defines the location 218 in two dimensions.

Therefore, every pixel of the substrate surface 204 can be mapped to two or more unique sets of ellipses. In the example, of FIGS. 3 and 4, every pixel or touch point on the surface 204 maps to one uniquely defined pair of ellipses having substantially perpendicular major axes. For each ellipse of a unique pair of ellipses, the position of the two foci (e.g., the transmitter 206 and one of the receivers 208, 210) plus the measured wave propagation time, which translates to a distance measurement, defines one ellipse.

In the example of FIGS. 3 and 4, in which one transducer 206 operates as a transmitter and two transducers 208 and 210 operate as receivers, a first set of ellipses has foci at the transducers 206 and 210 and a second set of ellipses has foci at the transducers 206 and 208. Consequently, time values thus can be determined for a multiplicity of ellipses in each set. Pixel coordinates further can be mapped to the time values, such that an intersection between ellipses from each set of ellipses corresponds to a location at which the substrate surface 204 was perturbed. The time values and pixel coordinates for the ellipses further can be stored as a look up table in memory, such as ROM.

Figure 5:
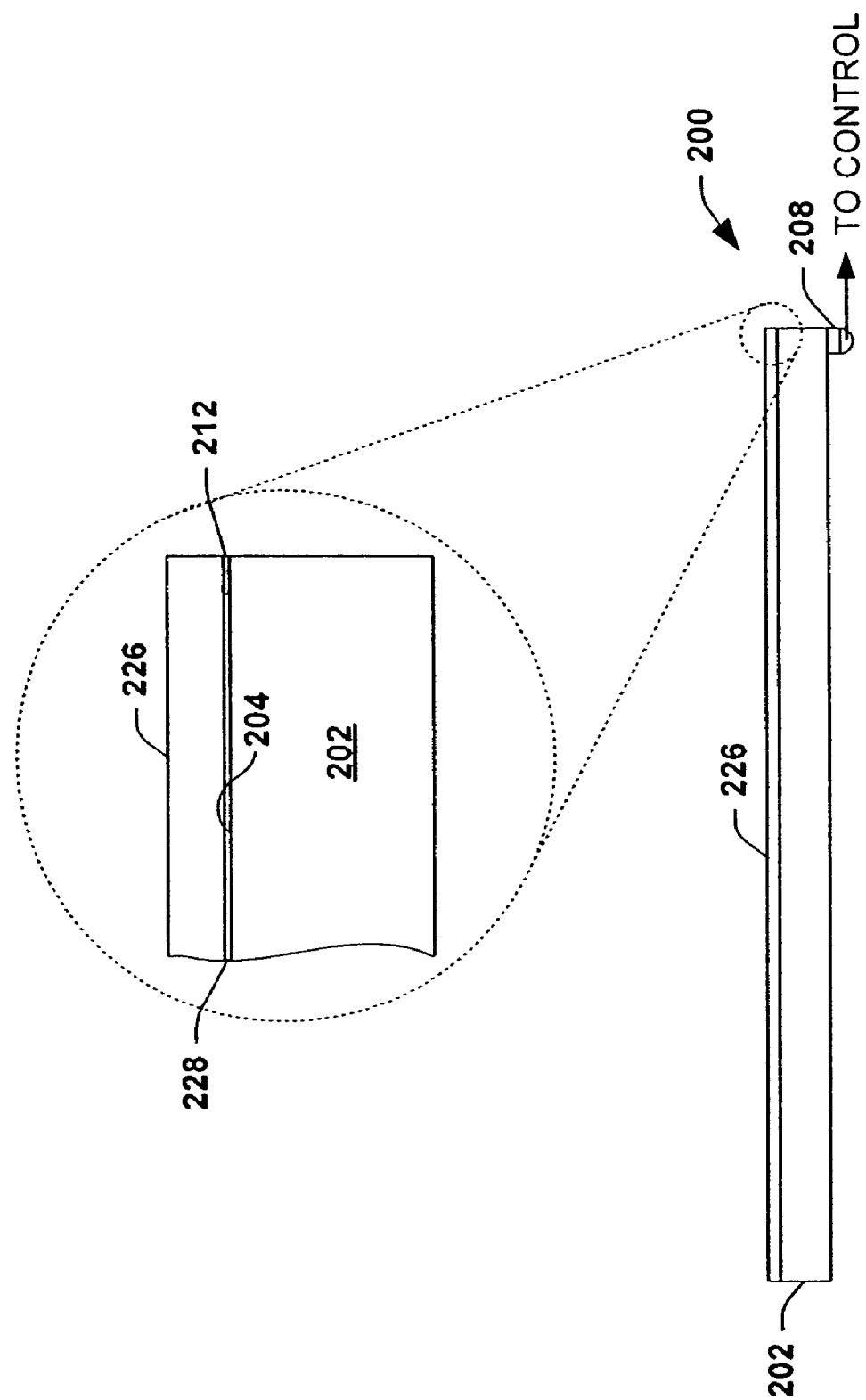
FIG. 5 is a side sectional view of part of a touch screen, in accordance with an aspect of the present invention, taken along line 5—5 of FIG. 4.

FIG. 5 illustrates a partial cross section taken along line 5—5 of FIG. 4, which depicts a sheet 226 of an elastically deformable material overlying the surface 204 of the substrate 202 in accordance with an aspect of the present invention. The sheet 226 can rest on dust particles (from ambient air) or fine powder particles distributed over the surface 204. The particles create an air gap 228 that inhibits coupling between the SAW and the sheet 226 in the absence of the surface 204 being perturbed. The dust particles can be introduced between the sheet 226 and the substrate surface 204 by applying the sheet onto the substrate 202 in an ordinary manufacturing environment. Alternatively, if the system 200 is fabricated in a clean environment, fine powder particles could be manually introduced between the sheet 226 and the substrate 202. The damping material 212 also can be employed between the sheet 226 and the substrate 202 helps to create the air gap 228. By way of example, the sheet 226 can be formed of a microsheet of glass material (e.g., Pyrex) having a thickness ranging from about 30 μm to about 300 μm, although other thicknesses could be utilized in accordance with an aspect of the present invention.

The sheet 226 provides a membrane that can be deformed locally so as to engage the substrate surface 204. The contact between the sheet 226 and the surface 204 scatters acoustic energy of a SAW transmitted by the transducer 206, which is similar to that produced by a finger or other object pressed directly on the substrate surface 204. In accordance with an aspect of the present invention, the sheet 226 has an acoustic impedance that substantially matches the substrate surface. As a result, energy loss from the SAW 216 (FIG. 3) to the sheet 226 is facilitated when the sheet contacts the surface 204, thereby increasing the amplitude of the scattered wave 220 (FIG. 4). That is, the locally deformed part of the sheet 226 tends to scatter a larger fraction of the incident energy when compared to an object having a greater propensity to absorb acoustic energy (e.g., a finger). As a result, the use of the overlying sheet 226 can increase the amplitude of the scattered SAW when compared to permitting a finger or other object to perturb a SAW on the surface 204 (e.g. it can increase the signal amplitude by 7 to 10 dB. The elastic deformation of the sheet 226 also produces a substantially uniform contact area on the substrate surface 110 that tends to average out irregularities, e.g., smoothing its angular distribution. In addition, the sheet 226 also helps protect the substrate surface 204 from liquid or other substances that could fall on to and/or remain on the surface.

Figure 6:
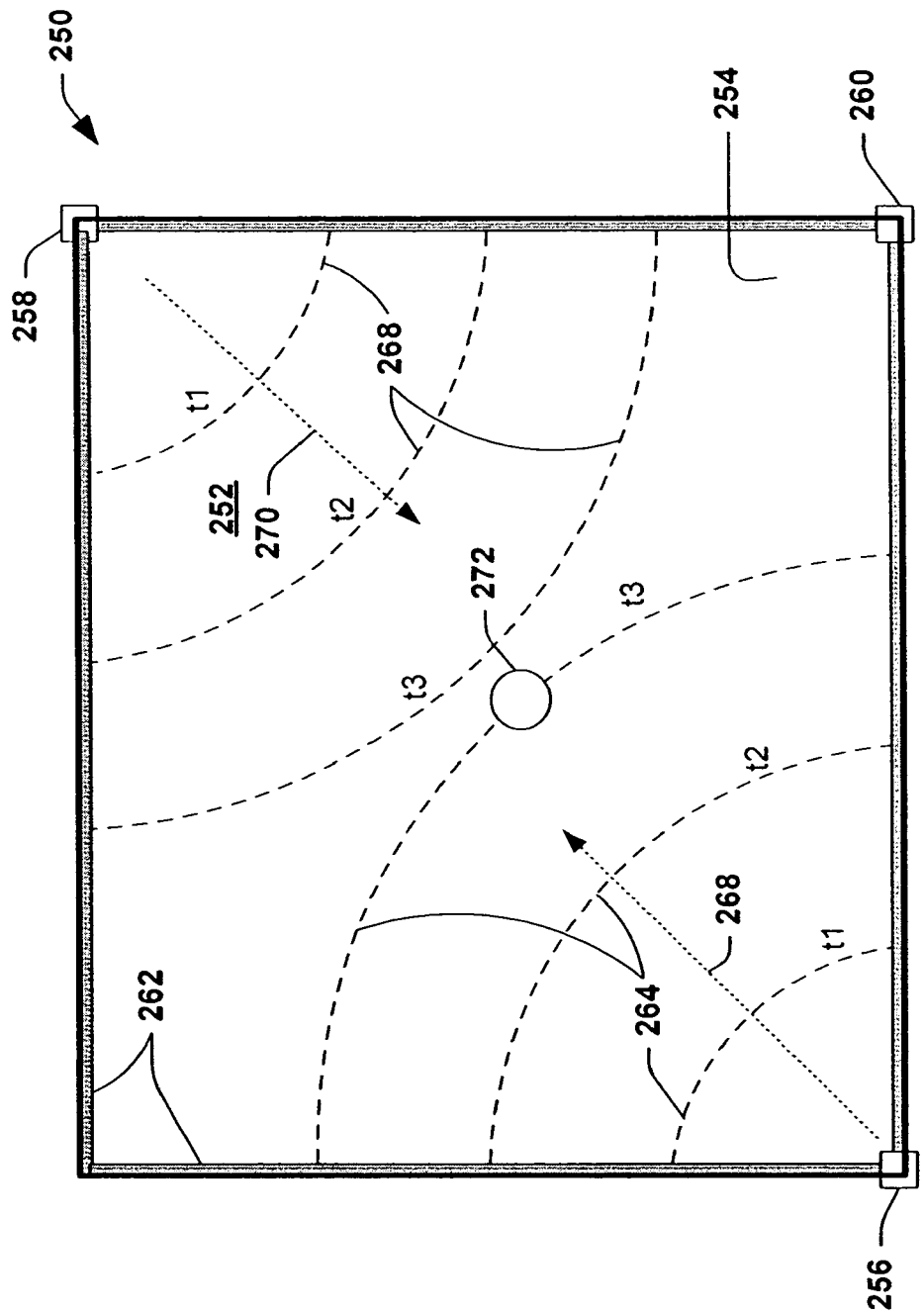
FIG. 6 is an example of a touch screen system, illustrating acoustic waves from transducers propagating across the surface of the screen in accordance with an aspect of the present invention.
Figure 7:
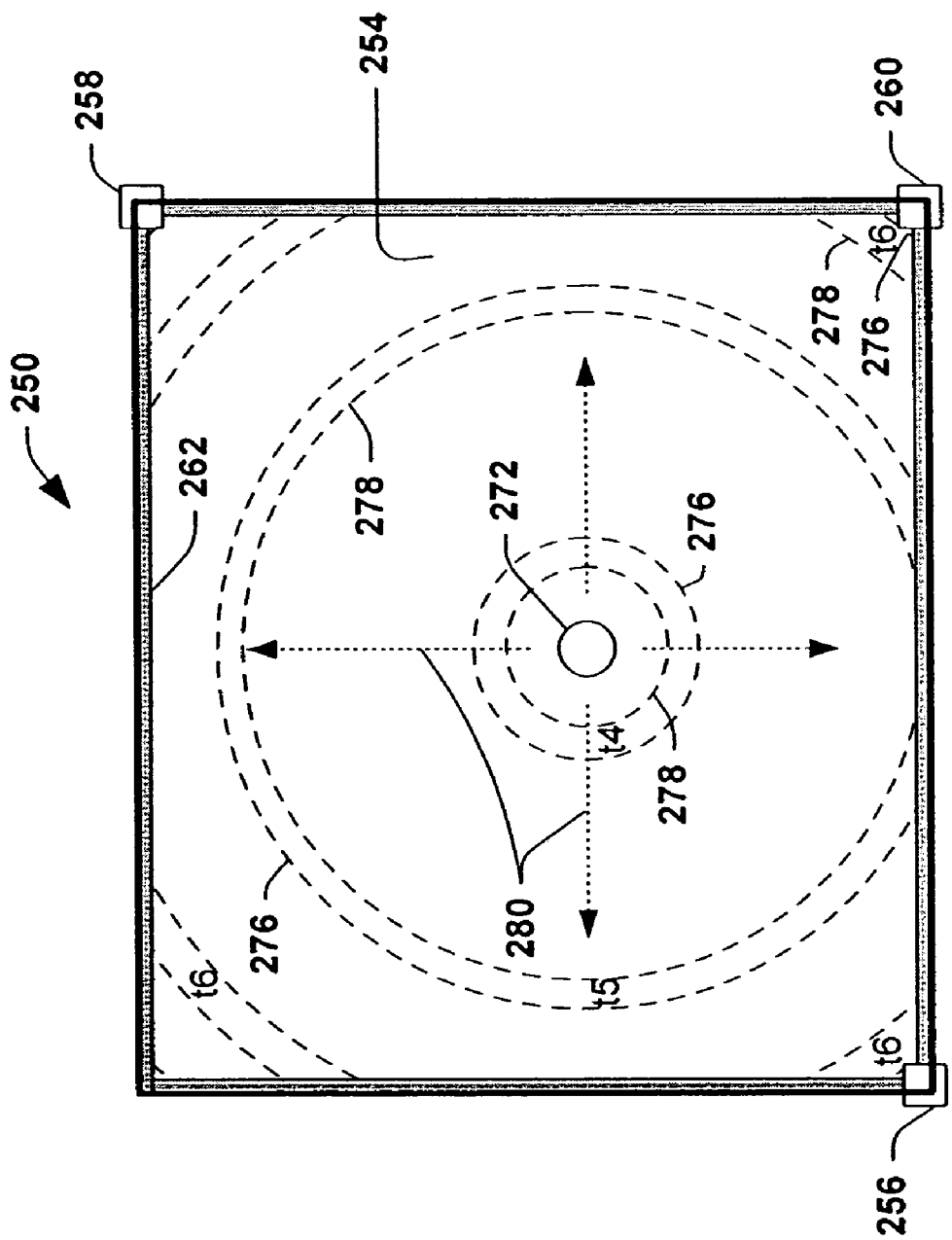
FIG. 7 is an example of the touch screen system of FIG. 6, illustrating acoustic waves scattering from a perturbation and propagating across the surface of the screen in accordance with an aspect of the present invention.

FIGS. 6 and 7 illustrates another example of touch screen system 250 that could be implemented in accordance with an aspect of the present invention. The system 250 includes a substrate 252, such as a faceplate, having a surface 254 along which SAWs can propagate. The substrate 252 can be formed of any suitable material to facilitate propagation of SAWs and other modes of plate waves, such as described herein.

A plurality of acoustic wave transducers 256, 258, and 260 are located at different corners of the substrate 252. In the example of FIGS. 6 and 7, the transducers 256 and 258 operate as transmitters and the other transducer 260 operates as a receiver. The transducers 256 and 258 are located at diagonally (or diametrically) opposed corners of the substrate 252.

In order mitigate interference from previous SAW transmissions, the edges of the substrate 252 also can be damped, such as by application of a suitable damping material 262 near a perimeter of the substrate in accordance with an aspect of the present invention. The damping material 262 has a high acoustic attenuation and acoustic impedance similar to the substrate 252.

The transducers 256 and 258 are controlled to transmit acoustic waves concurrently as pulses that propagate as respective SAWs 264 and 266 across the substrate surface 254. By way of example, the transducers can be controlled to transmit the SAWs substantially simultaneously, e.g., at time zero. Each of the SAWs 264, 266 is illustrated at different times t1, t2, t3 during its propagation. The SAW 264 propagates across the substrate surface 254 in the direction 268 and the SAW 266 propagates in the direction 270. As mentioned above with respect to FIGS. 3 and 4, the transducers 256, 258, and 260 are configured to transmit and/or receive SAWs at about 45° and with a diffraction angle of about 9020 . As a result, the transducers 256 and 258 can propagate SAWs across substantially the entire surface 254. The receiving transducer 260 also can receive signals arriving from a large range of angles.

In the example of FIGS. 6 and 7, the substrate surface 254 (or a microsheet over the surface) is perturbed at a location 272 (e.g., a touch point). Due to the relative distance between the location 272 and the transmitters 256 and 258, the SAW 264 arrives at the location 272 at about time t3 and the SAW 266 arrives at a later time (not shown). It is to be appreciated that the direct SAWs 264 and 266 will contact the location 272 at respective times based on the distance between the location and the respective transducers 256 and 256. A portion of the direct SAWs 264 and 268 continue to propagate across the surface 254 until they strike the edges of the substrate damping material 262 at the edges. The direct SAWs 264 and 266 also arrive at the other transducer 260 at times according to its distance relative to the respective transmitting transducers 256 and 258. Because each of the direct SAWs 264 and 266 arrives at the transducer 260 at substantially fixed times relative to the transmission, such signals can be ignored.

FIG. 7 illustrates SAWs 276 and 278 that scatter in a radially outward direction (indicated at 280) from the location 272 in response to the respective direct SAWs 264 and 266 contacting the object (e.g., finger, stylus, microsheet cover, etc.). The scattered SAWs 276 and 278 result from energy being absorbed by a microsheet cover or other object that contacts the substrate surface at 272. It is time associated with when the scattered SAWs 276 and 278 are detected at transducer 260, in contrast to a conventional touchscreen that detects the absorption of energy at the touch point, which is used to determine the location of the touch point 272.

In FIG. 7, the SAWs 276 and 278 are illustrated at different times t4, t5, and t6 during their radial propagation away from the location 272. As previously mentioned, the direct SAWs 264 and 268 from the respective transducers 256 and 258 arrive at the transducer 260 prior to the corresponding reflected and/or scattered SAWs 276 and 278. The distance between the scattered SAWs 276 and 278 remains substantially constant and is functionally related to the distance between the respective transmitters 256 and 258 relative to the location being perturbed 272. The distance between the SAWs 276 and 278 results in associated time delays from which the coordinates of the location 272 can be determined in accordance with an aspect of the present invention.

In the example of FIG. 7, the SAW 276 reaches the transducer 260 at time t6. The transducer 260, in turn, converts the SAW into a signal having an electrical characteristic indicative of the SAW 276 received by the transducer. The SAW 278 arrives at the transducer 260 at a time $t7=t6+t_{delay}$, which is converted into another electrical signal indicative thereof. The scattered SAWs 276 and 278 can be determined to arrive at the transducer 260 within a predictable time window relative to transmission time zero, which can be employed to facilitate gating the electrical signals corresponding to the scattered SAWs within such window. The times t6 and t7 can then be employed to derive an indication of the relative position or coordinates of the perturbation 272. For example, the determination of the coordinates of the location 272 on the substrate surface 254 can be determined by employing a lookup table, by calculations, or by empirical modeling, such as described herein.

By employing more than one transmitter and one receiver, it will be appreciated that the overall cost of such a system 250 could be reduced, as amplifying and gating incoming signals is generally more expensive than generating and delaying the outgoing pulse or pulses from the transmitting transducers 256 and 258.

Figure 8:
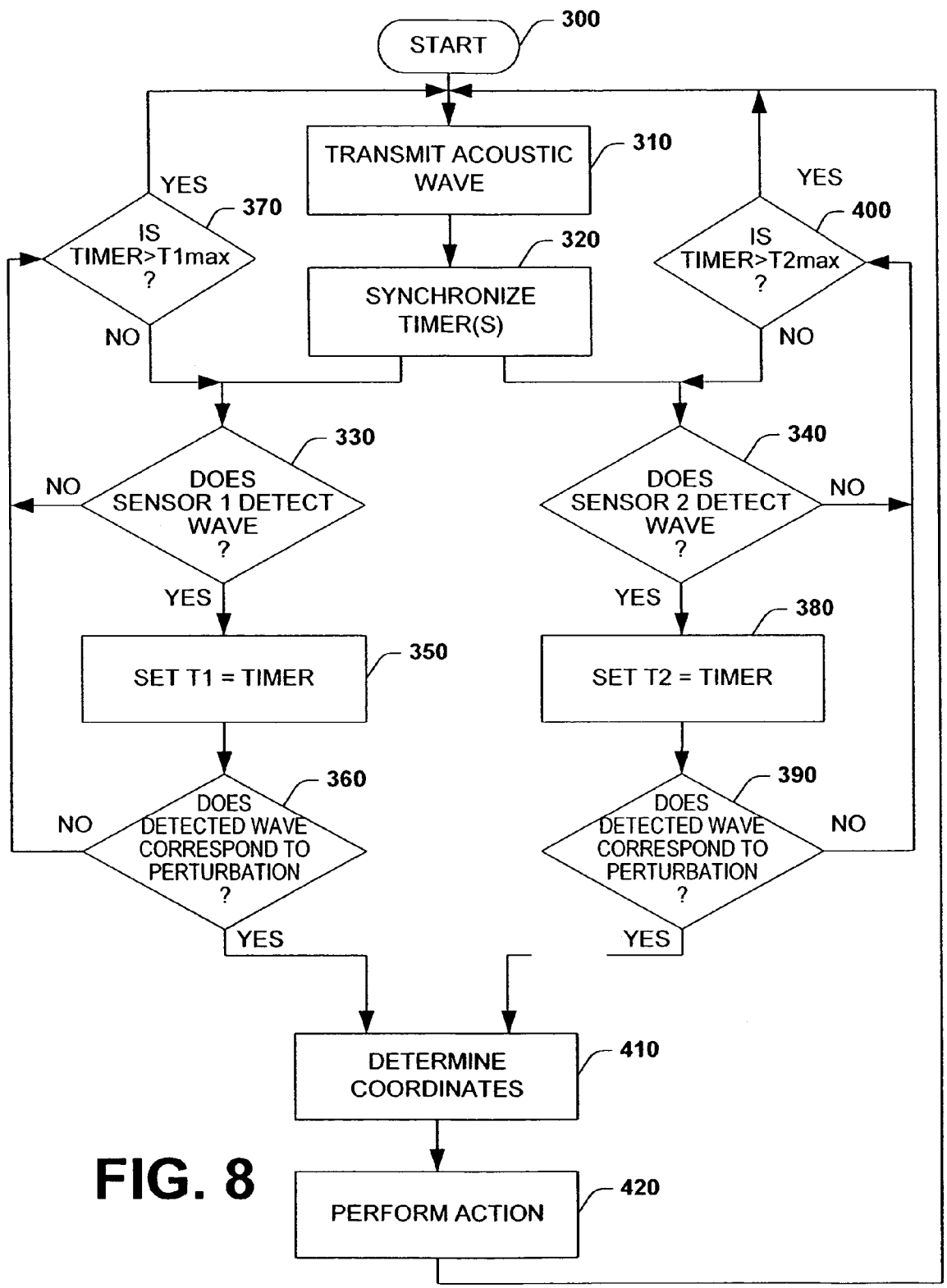
FIG. 8 is a flow diagram illustrating an example of a methodology for detecting a location of a screen perturbation in accordance with an aspect of the present invention.
Figure 9:
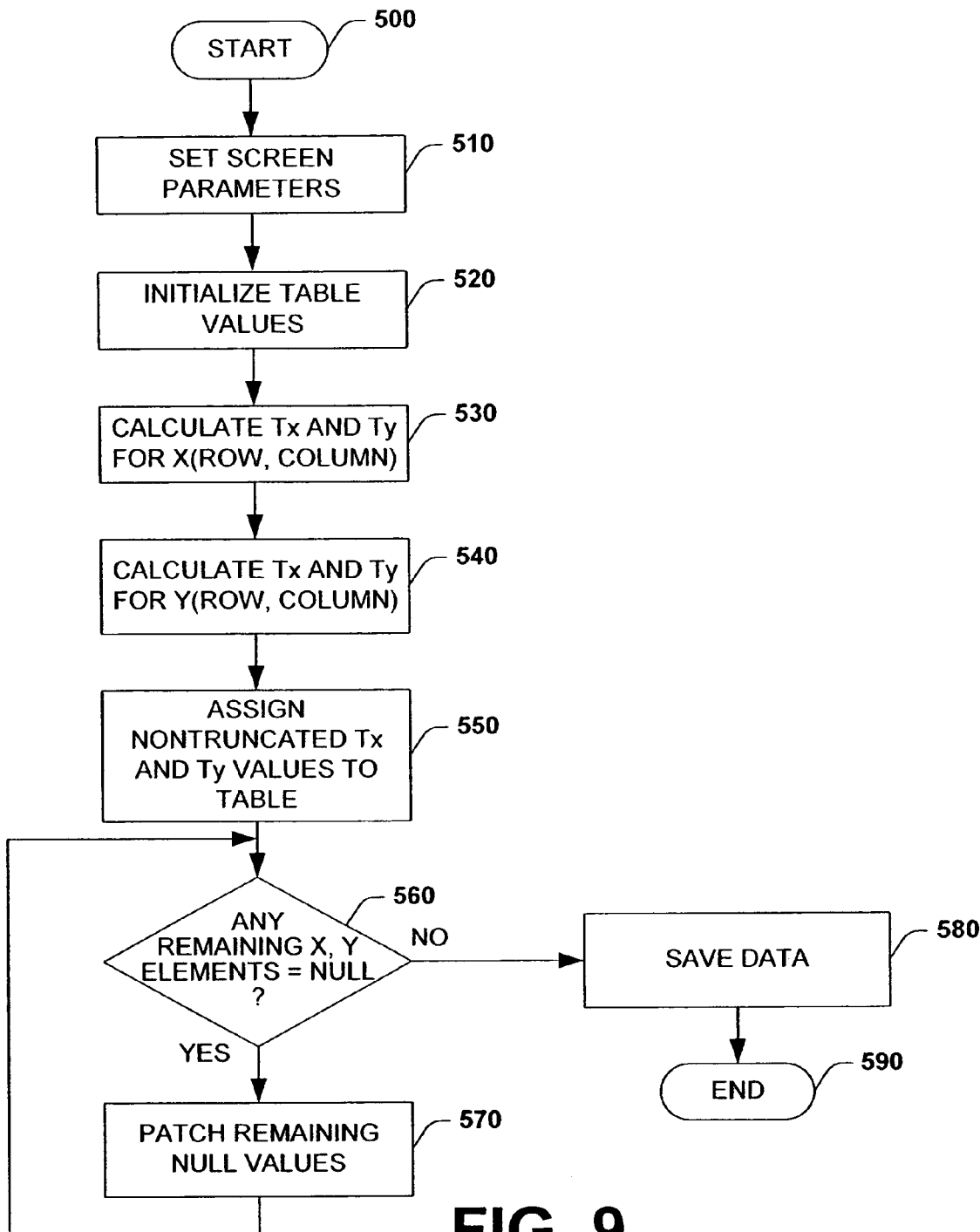
FIG. 9 is a flow diagram illustrating an example of a methodology for generating a look up table, which can be used with touch screen systems in accordance with an aspect of the present invention.

In view of the foregoing structural and functional features described above, methodologies that may be implemented in accordance with the present invention will be better appreciated with reference to FIGS. 8 and 9. While, for purposes of simplicity of explanation, the methodologies of FIGS. 8 and 9 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention. It is further to be appreciated that much or all of the following methodologies can be implemented as computer-executable instructions, such as software stored in a computer-readable medium or as hardware or as a combination of hardware and software.

FIG. 8 illustrates a methodology for implementing a touch screen system in accordance with an aspect of the present invention. In general, a plurality of acoustic wave transducers are operatively coupled to a substrate and are controlled to implement the following methodology. The methodology begins at 300 in which general initializations occur, such as in connection with activating an associated user interface. Such initializations can include allocating memory, establishing pointers, establishing data communications, acquiring resources, instantiating objects and setting initial values for variables. At 300, power also can be provided to associated circuitry to enable transmission and detection of acoustic waves (e.g., SAWs) in accordance with the present invention.

At 310, an acoustic wave is transmitted. By way of illustration the acoustic wave is a SAW that can propagate across the substantially entire surface of the substrate. The acoustic wave can be transmitted at a predetermined rate and have a desired wavelength or frequency to facilitate desired propagation across the substrate. For example, the acoustic wave can have frequency of about 1 MHz to about 5 MHz, or greater.

Next at 320, one or more respective timers associated with two or more receiver transducers (SENSOR 1 and SENSOR 2) are synchronized (or initialized) to the transmission at 310. In this way, the transmission at 310 operates as time zero for analysis of signals detected at SENSOR 1 and SENSOR 2. From 320, the methodology proceeds to 330 and to 340. The paths of the methodology associated with 330 and 340 correspond to functionality at different receiver transducers. While, for sake of brevity, the example of FIG. 8 illustrates two such paths corresponding to two respective transducers, identified as SENSOR 1 and SENSOR 2, it is to be understood and appreciated that more than two sensor paths could be utilized, such as when more than two sensors are employed to implement a methodology in accordance with an aspect of the present invention.

At 330, a determination is made as to whether an acoustic wave has been detected (or received) at SENSOR 1. When an acoustic wave is detected, SENSOR I converts the wave into a signal having an electrical characteristic indicative of the detected wave. The electrical signal can be analyzed to ascertain the properties of the detected wave. If SENSOR 1 detects a wave, the methodology proceeds to 350 in which a timer associated with SENSOR 1 is set to T1. T1 is a time delay from time zero when the wave is transmitted (310) until a corresponding wave, which can be a direct wave or a reflected wave, is detected at SENSOR 1. As mentioned above, such as with respect to FIGS. 6 and 7, the method alternatively could utilize plural transmitters and one or more receivers. Those skilled in the art will understand and appreciate how the methodology of FIG. 8 would be modified given such an arrangement in view of the description contained herein.

It is also to be appreciated that the methodology of FIG. 8 could implemented as part of a simulation, which might run on a personal computer, a work station, or other computer-implemented system. For example, instead of using actual acoustic transducers to generate and receive acoustic signals relative to a substrate surface, signals representing the transmitted and scattered acoustic waves could be generated as part of a simulation. A touch point also could be simulated based on receipt of a user input, such as from a user input device (e.g., a mouse or other pointing device), which results in simulated signals that represent the scattered acoustic waves. Time for the scattered acoustic waves to travel from the touch point to the simulated receiver(s) can be calculated and employed to determine coordinates of the touch point on the simulated screen. The simulation can have a plurality of user-selectable parameters, such as screen size or resolution, location of transmitter(s) and receiver(s), material properties of the substrate, or other factors that might affect the operation of a touch screen system in accordance with an aspect of the present invention. The particular form of calculations employed to determine coordinates of the touch point can be substantially identical to that described above. In addition, a lookup table based on the user selectable parameters also can be generated as part of the simulation, such as described below with respect to FIG. 9. It is to be appreciated that such simulation can be used for marketing purposes of a touch screen system, as well as to enable the accuracy of the calculations to be tested.

Next, at 360, a determination is made as to whether the detected wave could correspond to a perturbation of a substrate surface, such as in response to a finger, a stylus, or other object contacting the substrate surface along which the transmitted wave propagates. The determination can be made based on the time T1 and/or based on a count corresponding to the number waves received at SENSOR 1 in response to the wave transmitted at 310.

By way of illustration, because SENSOR 1 is located a fixed distance relative to a transducer that transmitted the wave at 310, a wave reflected and/or scattered from a perturbation at the substrate surface should arrive at SENSOR 1 within a predictable time window. Accordingly, if a wave arrives at SENSOR 1 at a time prior to such window, the wave is not due to contact with the substrate surface and likely corresponds to the direct wave transmitted at 310. If a wave arrives at SENSOR 1 at a time greater than the maximum time of the window, the wave corresponds to a reflection of the wave from an edge of the substrate.

By way of further illustration, the determination at 360 can be made by tracking the number of waves received at SENSOR 1 for a given acoustic wave transmission. That is, because SENSOR 1 is located a fixed distance relative to a transducer that transmitted the wave at 310, the first wave received at SENSOR 1 is the direct wave transmitted at 310. When there is a perturbation of the substrate surface, the second wave received corresponds to a wave that is reflected and/or scattered from the perturbation. Thus, only an electrical signal for a second wave can correspond to a perturbation and electrical signals; all other waves detected as a result of a given transmitted wave can be ignored. The determination of whether the second wave corresponds to a wave that has been reflected and/or scattered can be determined based on whether it is received within a predictable time window similar to that described in the preceding example. However, in order mitigate reflection of waves from the edges of the substrate, a damping material can be applied to a perimeter portion of the substrate, such that a second detected wave for a given transmitted wave corresponds to contact situation.

If the determination at 360 is negative, the methodology proceeds to 370 in which another determination is made as to whether the timer value has reached or exceeded a predetermined maximum time value (T$1_{max}$) relative to time zero at 320. If the 10 determination at 370 is negative, indicating that the maximum time has not been reached, the methodology returns to 330. T$1_{max}$ can be selected to correspond to a time outside a time window in which a wave reflected and/or scattered from a perturbation on the substrate surface could be expected to arrive at SENSOR 1.

The methodology associated with the path at 340 for SENSOR 2 is substantially similar to that just described with respect to SENSOR 1. Briefly stated, at 340 a determination is made as to whether an acoustic wave has been detected (or received) at SENSOR 2. When an acoustic wave is detected at SENSOR 1, the wave is converted into a signal having an electrical characteristic indicative of the detected wave. The electrical signal can be analyzed to ascertain the properties of the detected wave. If SENSOR 2 detects a wave, the methodology proceeds to 380 in which a timer associated with SENSOR 2 is set to T2, which is a time delay from time zero when the wave is transmitted (310) until a corresponding wave is detected at SENSOR 2.

Next, at 390, a determination is made as to whether the detected wave could correspond to a perturbation of a substrate surface, such as in response to a finger, a stylus, or other object contacting the substrate surface. As mentioned with respect to the path beginning at 330, the determination can be made based on the timer value of T2 and/or based on a count value corresponding to the number waves received at SENSOR 2 in response to the wave transmitted at 310. If the determination at 390 is negative, the methodology proceeds to 400.

At 400, a determination is made as to whether the value of T2 has reached or exceeded a predetermined maximum time value (T$2_{max}$) relative to time zero at 320. If the determination at 400 is negative, indicating that the maximum time has not been reached, the methodology returns to 340 to wait for another detected wave. T$2_{max}$ can be selected to correspond to a time outside a time window in which a wave reflected and/or scattered from a perturbation on the substrate surface could be expected to arrive at SENSOR 2.

T1$_{max}$ can be equal to T2$_{max}$, such as by selecting a value that is outside a permissible time window for both SENSOR 1 and SENSOR 2. If the determinations at 370 and 400 both indicate that a maximum time period has expired the methodology can return to 310 in which a next acoustic wave can be transmitted. It is to be understood and appreciated that the acoustic wave transducer can be configured to transmit the acoustic waves periodically at a fixed rate.

If the determinations at 360 and 390 indicate that the waves detected at SENSOR 1 and SENSOR 2 can correspond to a perturbation of the substrate surface, both paths proceed to 410. At 410, coordinates of the substrate are determined based on the values of T1 and T2. In accordance with an aspect of the present invention, T1 and T2 can define different ellipses, with the intersection of such ellipses being the location (coordinates of the substrate surface) at which the substrate surface was perturbed. An average coordinate value further can be determined by averaging over a plurality of transmitted waves (or pings) and interpolating such coordinates to find a center of mass for the coordinate values in the sample size.

By way of example, a lookup table, mathematical algorithm, or a model can be employed to identify coordinates corresponding to the intersection of such ellipses based on the values of T1 and T2. If the lookup table has time values for all pixel locations, it is straightforward to recover the coordinates from a measurement of the two acoustic time delays T1 and T2 with little or no CPU support. An example of how such a look up table can be generated is described with respect to FIG. 9. Alternatively, appropriate coordinates could be calculated on the fly based on, for example, known properties of the substrate, the frequency of the acoustic wave transmitted across the substrate surface, a desired resolution for the touch screen system, and the values of T1 and T2.

From 410, the methodology proceeds to 420 in which an action is performed based on the coordinates determined at 410. For example, a cursor can be mapped to part of a screen corresponding to the coordinates. Such mapping further can be employed to implement a function or method associated with the location to which the cursor is mapped. It is to be appreciated that such a function or method can be implemented with or without any mapping of a cursor to the determined coordinates. The particular action performed at 420 will vary depending on the application in which the methodology is being implemented. Some examples of possible applications that could utilize such a methodology include point-of-information kiosks, vending, electronic catalogs, in-store locators, corporate training, gaming, lottery, and amusement, multimedia marketing, banking/financial transactions, ticket sales, interactive education, multimedia demos, museum displays, and the like.

FIG. 9 illustrates an example of a methodology that can be employed to generate a lookup table, in accordance with an aspect of the present invention, such as for use in determining coordinates of a location at which a touch screen has been perturbed. In general, the lookup table relates a pair of acoustic delay times to the screen coordinates of all the potential touch points, based on a desired resolution of the screen. The methodology begins at 500 in which general initializations occur, such as can include allocating memory, establishing pointers, establishing data communications, acquiring resources, instantiating objects and initializing variables.

Next, at 510 system parameters are set. The system parameters, for example, can include the screen size, pixel size, the relative location of the transducers, acoustic properties of the substrate, etc. For example, if the screen is rectangular, a transmitting transducer can be placed at a first corner, with the other transducers located at adjacent corners that are diagonally opposed to each other. The transducer placement can be set by default according to a desired location and configuration, such as described herein. The screen size, for example, also can be selected by defining the number of pixels in the x and y directions, such as M×N, where M and are positive integers.

To recover the screen coordinates, in accordance with an aspect of the present invention, a pair of matrices X and Y is employed to hold the screen coordinates as their matrix elements for each respective receiving transducer. Each matrix is indexed by Tx and Ty values. The Tx and Ty values correspond to the two measured time delays in units of pixels. It is straightforward to calculate either Tx or Ty given values for the screen coordinates X and Y, such as by employing the Pythagorean theorem.

At 520, the table values are initialized. By way of illustration, the lookup table can be prepared by filling matrix elements for each pixel location with common predetermined values (e.g., a null or −1), which indicates the respective matrix element having such values have not yet been calculated. After the table has been prepared, the methodology proceeds to 530 in which matrix elements are calculated for matrix X, such as Tx and Ty values for each pixel. Next, at 540 the values of matrix elements for matrix Y are calculated in a similar manner.

For example, Tx can correspond to a time delay for an acoustic wave to travel from a transmitting acoustic wave transducer to a given pixel and Ty can correspond to a time delay for an acoustic wave to travel from the given pixel location to a receiving acoustic wave transducer. In accordance with an aspect of the present invention, Tx and Ty define a point on an ellipse corresponding to the pixel coordinates, of which ellipse the transmitting transducer and receiving transducer are foci. Because the coordinate values are known, a pair of loops thus can be iterated over for every pixel on the screen to calculate the Tx and Ty values at each respective pixel for each of the matrices X and Y according to the location of the transducers.

In order to facilitate use and storage of the resulting lookup table, the Tx and Ty values are truncated to integers and the matrix elements X(Tx, Ty) and Y(Tx, Ty) for the respective receiving transducers are assigned with corresponding integer values at 550. Because of the truncation errors, however, some pixel locations (Tx, Ty) might not have values written to them at 550, while others could be written to more than once.

Next at 560, a determination is made as to whether any matrix elements are still set to the initial value (e.g., null or −1). If the determination at 560 is affirmative, indicating that not all matrix elements have been assigned Tx and Ty values, each of the remaining elements is individually patched at 570.

By way of illustration, the patching operation can be implemented by examining the nearest neighbor matrix elements and averaging either horizontally or vertically or both relative to each matrix element requiring patching. Generally, averaging both should provide more accurate values, unless one of the nearest neighbor matrix elements was itself previously patched. That is, when an element is patched, an associated flag can be set to identify the element as patched. In this way, neighbors of a given matrix element that themselves have been patched can be avoided to mitigate introduction of errors when propagating the values of the lookup table. Additional averaging rules are applied to the edges of the arrays. By way of further illustration, the first row and first column can be patched first and then the remaining rows and columns are patched, such as by proceeding from left to right and top to bottom until all the matrix elements have been examined and patched as may be required. From 570, the methodology returns to 560.

An alternative approach to fill the lookup table, which provides a reasonable compromise between speed and accuracy, is to flag each matrix element that is not written to or that has been written to more than once. For each flagged matrix element, a forward solution is then calculated for the problem of intersecting ellipses using a least squares trial and error method. The least squares method can be performed with initial values and a search range set by the nearest neighbor matrix elements that were previously written to exactly once.

If the determination at 560 is negative, indicating that all matrix elements have been assigned, the methodology proceeds to 580. At 580, the data can be saved, including all matrix values. Thus, the end result can be used for simulation or loading a ROM (or other suitable memory storage device). After the lookup table data has been saved, the methodology proceeds to 590 in which the methodology ends. The resulting data can be employed to recover the screen coordinates corresponding to a location at which a faceplate or other substrate configured according to the parameters at 510 is perturbed.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A touch screen system, comprising:
   a substrate that has a surface;
   a plurality of acoustic wave transducers located near a perimeter of the substrate surface comprising at least a first acoustic wave transducer that transmits a first acoustic wave across the substrate surface and at least second and third acoustic wave transducers that receive acoustic waves; and
   a control component that determines a location of a perturbation based at least in part on time delays between transmission of the first acoustic wave from the first transducer and receipt of a second acoustic wave at each of the at least second and third transducers, the second acoustic wave is one of reflected and scattered from a location of a perturbation on the substrate surface.

2. The system of claim 1, the time delays between transmission of the first acoustic wave and receipt of the second acoustic wave at the second and third transducers define respective ellipses.

3. The system of claim 2, an intersection between the ellipses delineates a perturbation location on the surface of the substrate.

4. The system of claim 1, the surface of the substrate is at least one of soda-lime glass, borosilicate glass, a crown glass, a barium-containing glass, a strontium-containing glass, a boron-containing glass, a glass laminate capable of supporting acoustic wave propagation, a ceramic material, aluminum, an aluminum alloy, a coated aluminum substrate capable of supporting acoustic wave propagation, and a low-acoustic-loss polymer.

5. The system of claim 1, the plurality of acoustic wave transducers each comprises at least one piezoelectric element.

6. The system of claim 1, the at least first acoustic wave transducer converts an electrical signal into an acoustic wave that is propagated across the substrate surface.

7. The system of claim 1, the at least second and third receiving transducers convert an acoustic wave that is propagated across the substrate surface into an electrical signal that can be analyzed by the control component.

8. The system of claim 7, further comprising at least one grating associated with each of the at least second and third receiving transducers and disposed above the piezoelectric element of each receiving transducer.

9. The system of claim 7, further comprising an amplifier associated with each of the at least second and third receiving transducers that amplifies the electrical signal produced by the receiving component for analysis by the control component.

10. A method for determining a location of a perturbation on a substrate surface, comprising:
    transmitting an acoustic wave across a substrate surface from one or more transducers coupled to a perimeter of the substrate surface;
    detecting the transmitted acoustic wave at two or more points near the perimeter of the substrate surface;
    converting the detected acoustic waves into electrical signals;
    analyzing the electrical signals to determine time delays between transmission of the acoustic wave and receipt of the transmitted acoustic wave at each receiving transducer;
    determining a location of perturbation of the substrate surface based at least in part on the time delays.

11. The method of claim 10, further comprising transmitting the acoustic wave at a broad diffraction angle to propagate the wave across the entire substrate surface.

12. The method of claim 11, further comprising perturbing the substrate surface to deflect the transmitted acoustic wave.

13. The method of claim 10, further comprising employing gratings in close proximity to each of at least two receiving transducers to direct an incoming acoustic wave longitudinally to each respective receiving transducer.

14. A system for determining a perturbation location on a substrate surface, comprising:
    means for converting an electrical signal into a mechanical signal that stresses the substrate surface;
    means for transmitting the mechanical signal as an acoustic wave across a substrate surface from at least one acoustic wave transducer that is coupled to the substrate surface;
    means for receiving the transmitted acoustic wave at two or more points near the perimeter of the substrate surface; and
    means for determining a location of a perturbation of the substrate surface based at least in part on time delays between transmission and receipt of the acoustic wave.

15. The system of claim 14, further comprising means for longitudinally directing a transmitted acoustic wave to the means for receiving the transmitted acoustic wave.

16. The system of claim 14, further comprising means for convening a mechanical stress signal to an electrical signal indicative of the mechanical stress signal.

* * * * *